(12) United States Patent
Fu et al.

(10) Patent No.: US 10,393,346 B2
(45) Date of Patent: Aug. 27, 2019

(54) LIGHT EMITTING MODULE WITH CONCAVE REFLECTING STRUCTURE, DISPLAY DEVICE WITH LIGHT EMITTING MODULE AND METHOD FOR MANUFACTURING LIGHT EMITTING MODULE WITH CONCAVE REFLECTING STRUCTURE

(71) Applicant: BOE TECHNOLOGY GROUP CO., LTD., Beijing (CN)

(72) Inventors: Jie Fu, Beijing (CN); Xiaochuan Chen, Beijing (CN); Shengji Yang, Beijing (CN); Dongni Liu, Beijing (CN); Lei Wang, Beijing (CN); Li Xiao, Beijing (CN); Han Yue, Beijing (CN); Pengcheng Lu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 53 days.

(21) Appl. No.: 15/708,085

(22) Filed: Sep. 18, 2017

(65) Prior Publication Data
US 2018/0180252 A1  Jun. 28, 2018

(30) Foreign Application Priority Data

Dec. 27, 2016 (CN) .......................... 2016 1 1230298

(51) Int. Cl.
*F21V 7/06* (2006.01)
*F21V 5/04* (2006.01)
(Continued)

(52) U.S. Cl.
CPC ................ *F21V 7/06* (2013.01); *B23P 19/04* (2013.01); *F21V 5/04* (2013.01); *H01L 27/3283* (2013.01);
(Continued)

(58) Field of Classification Search
CPC .............. F21V 7/06; F21V 5/04; H05K 13/04
See application file for complete search history.

(56) References Cited

U.S. PATENT DOCUMENTS 8,304,796 B2 * 11/2012 Fukuda ............... H01L 51/5268
257/98
9,035,333 B2 * 5/2015 Toyama ............. H01L 25/0753
257/88
(Continued)

*Primary Examiner* — Joseph L Williams
(74) *Attorney, Agent, or Firm* — Kinney & Lange, P.A.

(57) ABSTRACT

Disclosed herein are a light emitting module, a display device and a method for manufacturing a light emitting module. The light emitting module includes a substrate provided with a concave reflecting structure, a first planarizing layer being arranged on the concave reflecting structure, a first anode being arranged on the first planarizing layer, a light emitting layer being arranged on the first anode, an opening of the concave reflecting structure facing the light emitting layer and a vertical distance from the bottom of the concave reflecting structure to the light emitting layer is a preset distance, a cathode being arranged on the light emitting layer. The method includes: forming a concave reflecting structure on a substrate, forming a first planarizing layer on the concave reflecting structure; forming a first anode on the first planarizing layer; forming a light emitting layer on the first anode; forming a cathode on the light emitting layer.

10 Claims, 5 Drawing Sheets

(51) Int. Cl.
*H05K 13/04* (2006.01)
*B23P 19/04* (2006.01)
*H01L 51/52* (2006.01)
*H01L 27/32* (2006.01)

(52) U.S. Cl.
CPC ...... *H01L 27/3288* (2013.01); *H01L 51/5271* (2013.01); *H05K 13/04* (2013.01); *H01L 27/3204* (2013.01)

(56) References Cited

U.S. PATENT DOCUMENTS

| | | | |
|---|---|---|---|
| 2005/0139851 A1* | 6/2005 | Sato | H01L 33/507 257/99 |
| 2007/0164653 A1* | 7/2007 | Song | B82Y 10/00 313/495 |
| 2014/0326996 A1* | 11/2014 | Yamazaki | G02F 1/136227 257/43 |
| 2015/0270461 A1* | 9/2015 | Fujimori | H01L 33/60 438/27 |

* cited by examiner

LIGHT EMITTING MODULE WITH CONCAVE REFLECTING STRUCTURE, DISPLAY DEVICE WITH LIGHT EMITTING MODULE AND METHOD FOR MANUFACTURING LIGHT EMITTING MODULE WITH CONCAVE REFLECTING STRUCTURE

CROSS-REFERENCE TO RELATED APPLICATION

This application claims the benefit of Chinese Patent Application No. 201611230298.0 filed on Dec. 27, 2016 in the State Intellectual Property Office of China, the whole disclosure of which is incorporated herein by reference.

BACKGROUND OF THE INVENTION

Field of the Invention

The present disclosure relates to a display field, especially to a light emitting module, a display device and a method for manufacturing a light emitting module.

Description of the Related Art

A liquid crystal panel is an important component for producing a liquid crystal display (LCD) due to the advantages such as having light-weight and being thin. Since the liquid crystal panel itself does not emit light, it is necessary to provide a backlight in the LCD. The backlight generates light and irradiates the generated light onto the liquid crystal panel. The liquid crystal panel modulates the irradiated light to create a picture.

In a LCD, each backlight corresponds to one or more pixels on the liquid crystal panel, and each backlight irradiates generated light onto its corresponding pixel or pixels. However, the light generated by the backlight can be irradiated in various directions, such that the backlight irradiates generated light not only onto its corresponding pixel or pixels, but also onto other pixels, which results in a large crosstalk.

SUMMARY OF THE INVENTION

In order to reduce crosstalk, the embodiments of the present disclosure provide a light emitting module, a display device and a method for manufacturing a light emitting module.

According to an aspect of the present disclosure, there is provided a light emitting module comprising, a substrate, a concave reflecting structure on the substrate, a first planarizing layer on the concave reflecting structure, a first anode on the first planarizing layer, a light emitting layer on the first anode, an opening of the concave reflecting structure facing the light emitting layer and a vertical distance from the bottom of the concave reflecting structure to the light emitting layer is a preset distance, and a cathode on the light emitting layer.

Optionally, the preset distance is a focal length of a concave lens corresponding to the concave reflecting structure.

Optionally, the light emitting module further comprises a second planarizing layer, and the concave reflecting structure is a concave reflecting film; the second planarizing layer is arranged on the substrate, and the second planarizing layer is provided with a groove; and the concave reflecting film being provided on the groove of the second planarizing layer.

Optionally, the material of the concave reflecting film is metal.

Optionally, the second planarizing layer is provided with a second anode thereon, and the second anode is located between the second planarizing layer and the concave reflecting film, the first anode and the second anode being electrically connected.

Optionally, the first planarizing layer is further provided with a via hole therein, and the first anode and the second anode are electrically connected with each other through the via hole.

According to another aspect of the present disclosure, there is provided a display device, which comprises a light emitting module as above mentioned.

Optionally, the display device comprises a plurality of light emitting modules arranged in an array; the second anodes of each row of light emitting modules are connected in series and the cathodes of each column of light emitting modules are connected in series; or the cathodes of each row of light emitting modules are connected in series and the second anode of each column of light emitting modules are connected in series.

According to another aspect of the present disclosure, there is provided a method for manufacturing a light emitting module, comprising, forming a concave reflecting structure on a substrate, forming a first planarizing layer on the concave reflecting structure, forming a first anode on the first planarizing layer, forming a light emitting layer on the first anode, an opening of the concave reflecting structure facing the light emitting layer and a vertical distance from the bottom of the concave reflecting structure to the light emitting layer is a preset distance, and forming a cathode on the light emitting layer.

Optionally, forming a concave reflecting structure on a substrate comprises forming a second planarizing layer on the substrate and forming a groove on the second planarizing layer by a single patterning process; and forming a concave reflecting film on the groove.

BRIEF DESCRIPTION OF THE DRAWINGS

FIG. 1-2 is a schematic structural view of another light emitting module provided by an embodiment of the present disclosure;

FIG. 1-3 is a schematic structural view of another light emitting module provided by an embodiment of the present disclosure;

FIG. 1-4 is a schematic structural view of another light emitting module provided by an embodiment of the present disclosure;

FIG. 2 is a schematic structural view of a display device provided in an embodiment of the present disclosure;

FIG. 3-1 is a flow chart of a method of manufacturing a light emitting module provided by an embodiment of the present disclosure; and FIGS. 3-2 to 3-5 are schematic views showing the process of manufacturing a light emitting module provided by yet another embodiment of the present disclosure.

DETAILED DESCRIPTION

For making the purpose, technical aspects and advantages of the present disclosure clearer, the presently disclosed embodiments will be further described in detail below with reference to the accompanying drawings.

Figure 1:
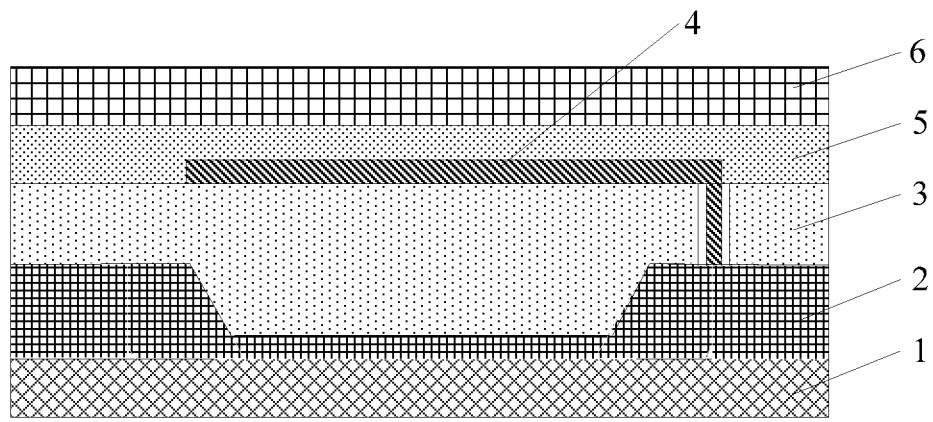
FIG. 1-1 is a schematic structural view of a light emitting module provided by an embodiment of the present disclosure.

Referring to FIG. 1-1, an embodiment of the present disclosure provides a light emitting module. The light emitting module comprises a substrate 1, a concave reflecting structure 2 being arranged on a substrate 1, a first planarizing layer 3 being arranged on the concave reflecting structure 2, a first anode 4 being arranged on the first planarizing layer 3, a light emitting layer 5 being arranged on the first anode 4, and a cathode 6 being arranged on the light emitting layer 5. An opening of the concave reflecting structure 2 faces the light emitting layer 5 and a vertical distance from the bottom of the concave reflecting structure 2 to the light emitting layer 5 is a preset distance.

The light emitting layer 5 generates light when the first anode 4 and the cathode 6 are energized. Most of the generated light is irradiated in a direction towards the concave reflecting structure 2. The concave reflecting structure 2 may reflect the light generated by the light-emitting layer 5 and convert it into collimated light with high-intensity. The collimated light is light propagating in the same direction, and the collimated light passes through the cathode 6 and emits outside. As such, the light generated by the light emitting layer 5 is propagated in the same direction as much as possible, thereby reducing the degree of crosstalk.

Optionally, the preset distance is a focal length of a concave lens corresponding to the concave reflecting structure 2.

The preset distance is the distance between the focal point of the concave reflecting structure 2 and the bottom of the concave reflecting structure 2 so as to ensure that the light emitting layer 5 is located at a level of the focal point of the concave lens corresponding to the concave reflecting structure 2, which makes it possible to optimize the collimating effect of the light generated by the concave reflecting structure 2.

Figures 1, 2:
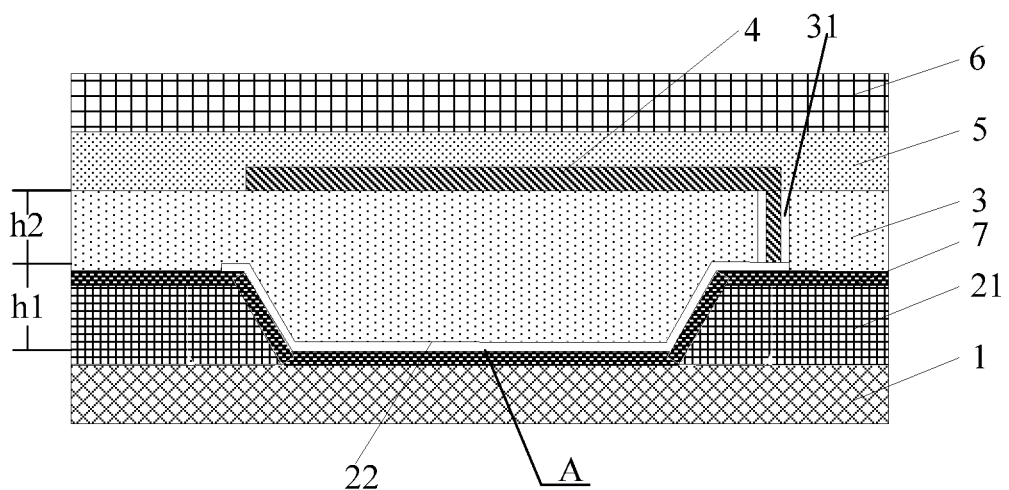

Optionally, referring to FIG. 1-2, the light emitting module further comprises a second planarizing layer 21, and the concave reflecting structure 2 may be a concave reflecting film 22.

The second planarizing layer 21 is arranged on the substrate 1, and the second planarizing layer 21 is provided with a groove. The concave reflecting film 22 is provided on the groove of the second planarizing layer 21.

The opening of the concave reflecting film 22 faces the light emitting layer 5, and thus the light irradiated from the light emitting layer 5 can be reflected and converted into collimated light with high-intensity which passes through the cathode 6 and emits outside.

The concave reflecting film 22 does not need to entirely cover the second planarizing layer 21, as long as its area is slightly larger than the surface area of the groove provided on the second planarizing layer 21. Since the concave reflecting film 22 does not entirely cover the second planarizing layer 21, the concave reflecting film 22 only reflects the light generated by the light emitting layer 5 and converges the reflected light into collimated light, avoiding reflecting natural light.

The material of the first planarizing layer 3 and the second planarizing layer 21 may be transparent resin. The material of the concave reflecting film 22 may be a metallic material, for example, a metallic silver. The material of the first anode 4 may be a transparent metal material. The material of the light emitting layer 5 is a light emitting material, and the light emitting material in the light emitting layer 5 generates light when the first anode 4 and the cathode 6 are energized. The material of the cathode 6 may be a transparent metal oxide, for example, IZO.

Optionally, referring FIG. 1-2, the second planarizing layer 21 is provided with a second anode 7 thereon, and the second anode 7 is located between the second planarizing layer 21 and the concave reflecting film 22. The second anode 7 and the first anode 4 are electrically connected.

The material of the second anode 7 is a metallic material and may be a transparent metal material. The second anode 7 may be electrically connected to an external power source, and the first anode 4 may be energized by the external power source through the second anode 7.

Optionally, the first planarizing layer 3 is provided with a via hole 31 therein, and the first anode 4 and the second anode 7 are electrically connected with each other through the via hole 31.

The first anode 4 is connected to the second anode 7 through the concave reflecting film 22. Specifically, the first anode 4 is electrically connected to the concave reflecting film 22 directly through the via hole 31, and the concave reflecting film 22 covers onto the second anode 7. In addition, since the material of the concave reflecting film 22 is metal, the first anode 4 and the second anode 7 can be connected electrically through the concave reflecting film 22.

Optionally, referring to FIG. 1-2, the bottom of the concave reflecting structure 2 is the bottom of the concave reflecting film 22, which is designated by the position A as shown in FIG. 1-2. The vertical distance between the bottom of the concave reflecting structure 2 and the light emitting layer 5 is the vertical distance between the bottom position A of the concave reflecting film 22 and the light emitting layer 5, so the vertical distance between the bottom A of the concave reflecting film 22 and the light emitting layer 5 is a preset distance, which equals to the sum of the height h1 of the concave portion formed by the concave reflecting film 22 and the distance h2 between the highest point of the concave reflecting film 22 and the light emitting layer 5.

Figures 1, 2, 3:
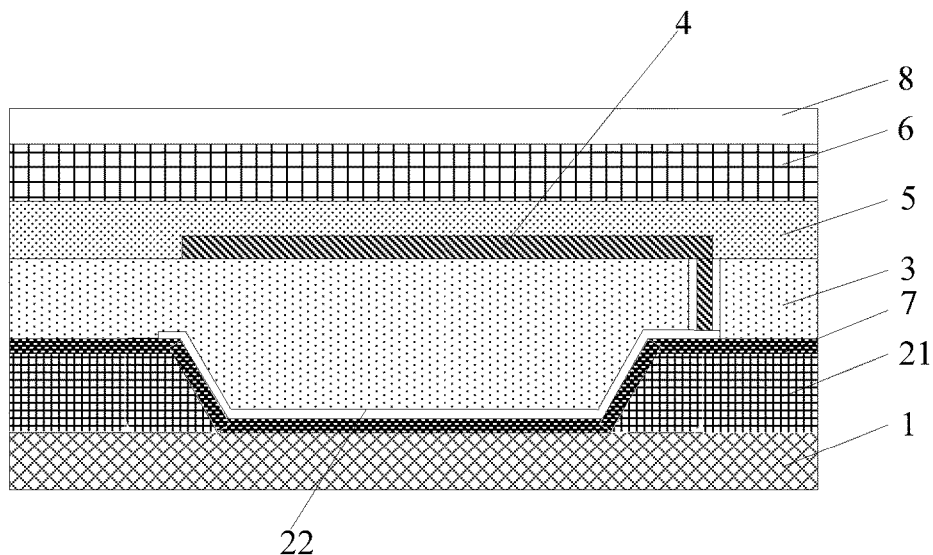

Optionally, referring to FIG. 1-3, a transparent cover plate 8 is also provided on the cathode 6. The transparent cover plate 8 may protect the cathode 6 and the like.

Here, in the present embodiment, the light emitting module may be a backlight of a liquid crystal display panel or may be a pixel on an array substrate. Referring to FIG. 1-4, when functioning as a backlight, the liquid crystal display panel is located on a side of the cover plate 8 away from the light emitting layer 5.

In the embodiment of the present disclosure, the light generated by the light-emitting layer can be reflected and converted into collimated light with high-intensity by the concave reflecting structure. The collimated light is light propagating in the same direction, and the collimated light passes through the cathode and emit outside. As such, the light generated by the light emitting layer is propagated in the same direction as much as possible, thereby reducing the degree of crosstalk.

Referring to FIG. 2, an embodiment of the present disclosure provides a display device, which comprises a light emitting module B as above mentioned.

Optionally, also referring to FIG. 2, the display device may comprise a plurality of light emitting modules B arranged in an array.

The second anode of each row of light emitting modules B are connected in series and the cathodes of each column of light emitting modules B are connected in series; or the cathodes of each row of light emitting modules B are connected in series and the second anode of each column of light emitting modules B are connected in series.

The second anodes of each row of the light emitting module B are electrically connected to a driving circuit, and the cathodes of each column of the light emitting module B are electrically connected to the driving circuit, or the cathodes of each row of the light emitting module B are electrically connected to the driving circuit, and the cathodes of each column of the light emitting module B are electrically connected to the drive circuit. A specific light emitting module B can be controlled to emit light or not emit light by the driving circuit.

In the present embodiment, respective light emitting modules constituting the display device may reflect and convert the light generated by the light-emitting layer into collimated light with high-intensity through the concave reflecting structure. The collimated light is light propagating in the same direction, and the collimated light passes through the cathode and emits outside. As such, the light generated by the light emitting layer is propagated in the same direction as much as possible, thereby reducing the degree of crosstalk.

Referring to FIG. 3-1, an embodiment of the present disclosure provides a method for manufacturing a light emitting module, comprising, Step 301: forming a concave reflecting structure 2 on a substrate 1.

Specifically, a second planarizing layer 21 is formed on the substrate 1, a groove is formed on the second planarizing layer 21 by a patterning process and a concave reflecting film 22 is formed on the groove. A second anode 7 is also formed between the second planarizing layer 21 and the concave reflecting film 22.

Referring to FIG. 3-2, in the process of actual implementation, as shown in FIG. a in FIG. 3-2, a second planarizing layer 21 is firstly formed by depositing a layer of transparent resin material on the substrate 1; secondly, as shown in FIG. b in FIG. 3-2, the second planarizing layer 21 is subjected to a first patterning process including exposure, development, and the like, such that a groove is formed in the second planarizing layer 21; and then, as shown in FIG. c in FIG. 3-2, a layer of transparent metal material is deposited on the second planarizing layer 21 and a second anode 7 is formed by a second patterning process, the second anode 7 also has a groove;

finally, as shown in FIG. d in FIG. 3-2, a layer of metal material is deposited on the groove of the second anode 7, which metal material may be a metallic silver or the like, and the metal material is subjected to a third patterning process such as sputtering to form a concave reflecting film 22.

Step 302: forming a first planarizing layer 3 on the concave reflecting structure 2.

Specifically, referring to FIG. 3-3, a layer of transparent resin material is deposited on the second anode 7 and the concave reflecting film 22 to form the first planarizing layer 3, and then the via hole 31 is formed in the first planarizing layer 3 by a fourth patterning process. The via hole 31 is communicated with the concave reflecting film 22.

Step 303: forming a first anode 4 on the first planarizing layer 3.

Figures 1, 2, 3, 4:
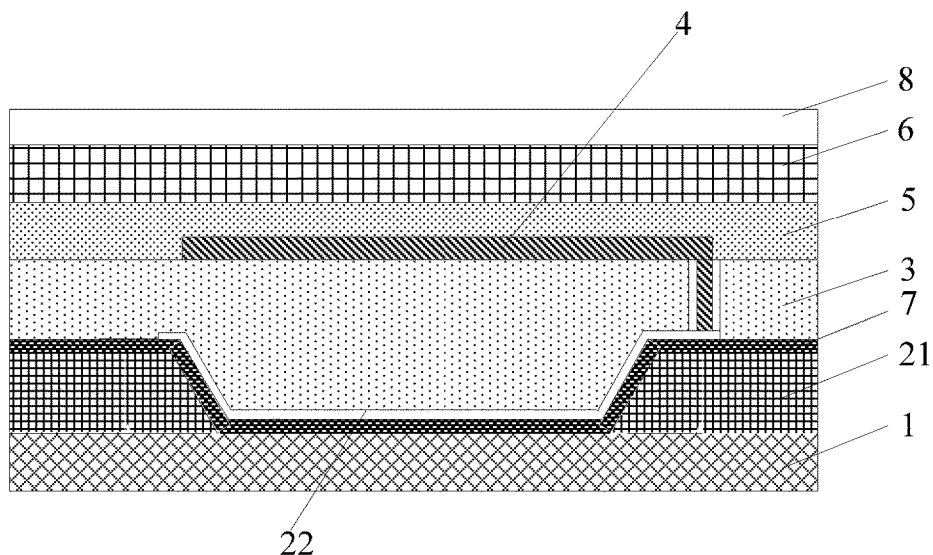
Figure 2:
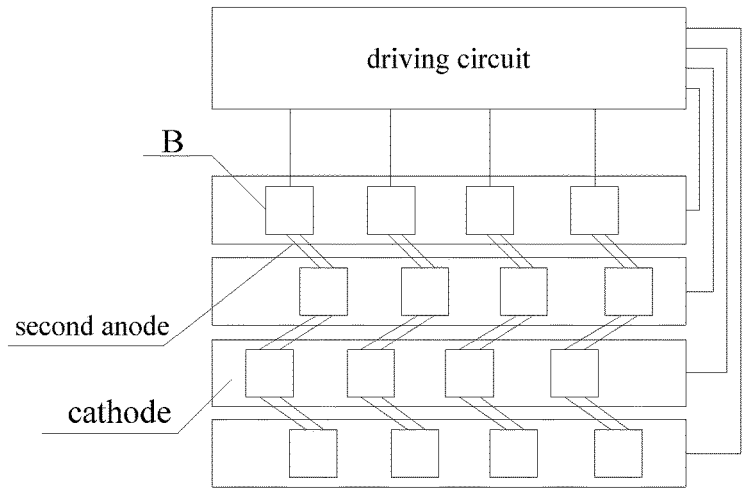

Specifically, referring to FIG. 3-4, a transparent metal material is deposited on the first planarizing layer 3 and the via hole 31, and then a fifth patterning process is performed on the transparent metal material to form the first anode 4. The first anode 4 is electrically connected to the concave reflecting film 22 through the via hole 31. Since the concave reflecting film 22 is located on the second anode 7 and the material of the concave reflecting film 22 is also a metallic material, the first anode 4 and the second anode 7 are also electrically connected.

Step 304: forming a light emitting layer 5 on the first anode 4, such that an opening of the concave reflecting structure 2 facing and aligning with the light emitting layer 5 and a vertical distance from the bottom of the concave reflecting structure 2 to the light emitting layer 5 is a preset distance.

Figures 1, 3:
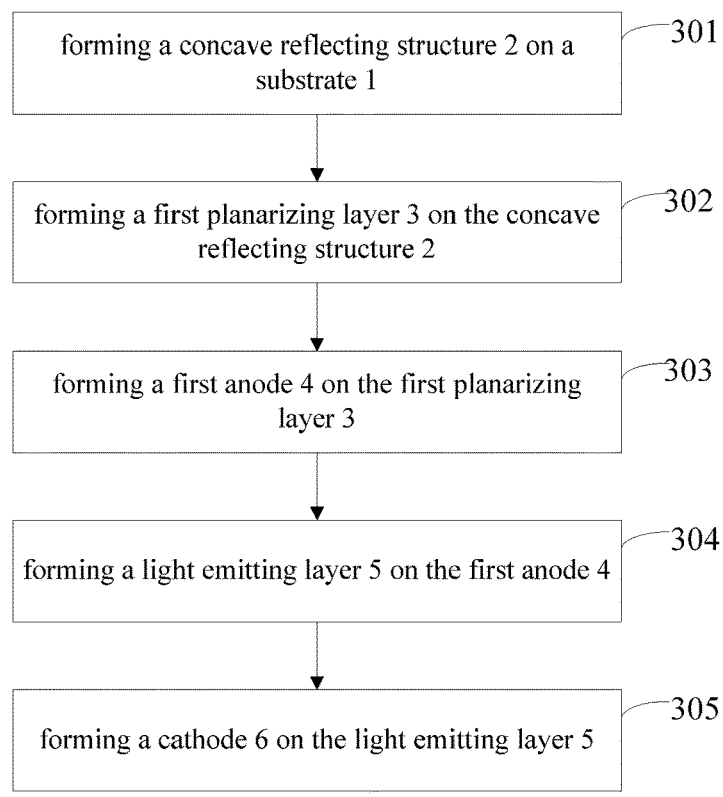
Figures 2, 3:
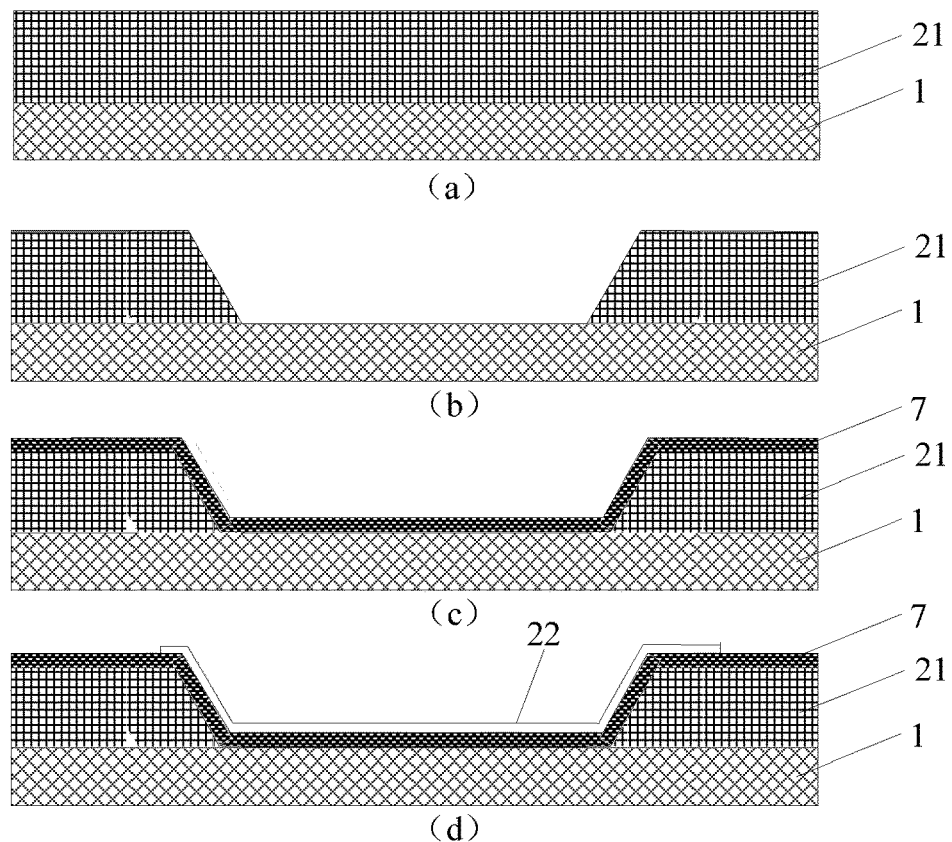
Figure 3:
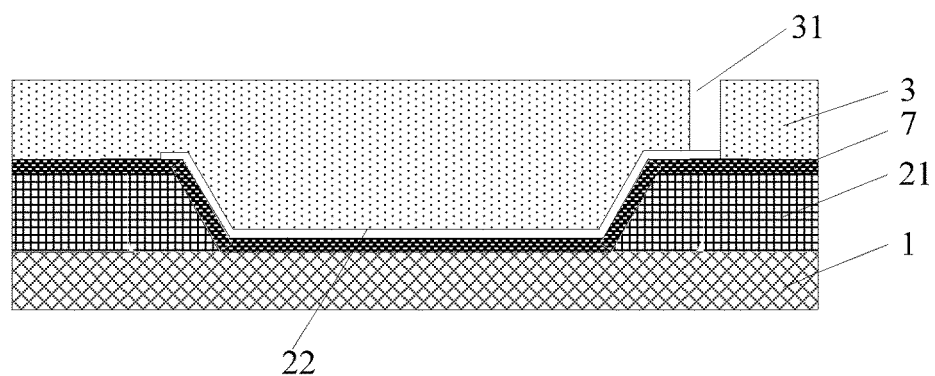
Figures 3, 4:
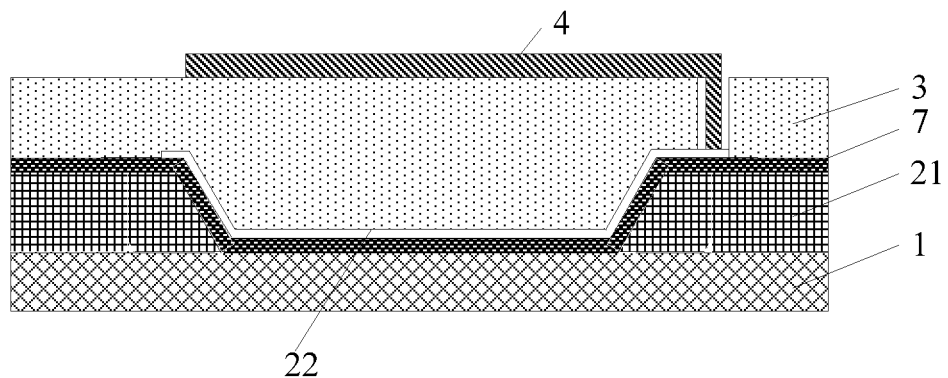
Figures 3, 4, 5:
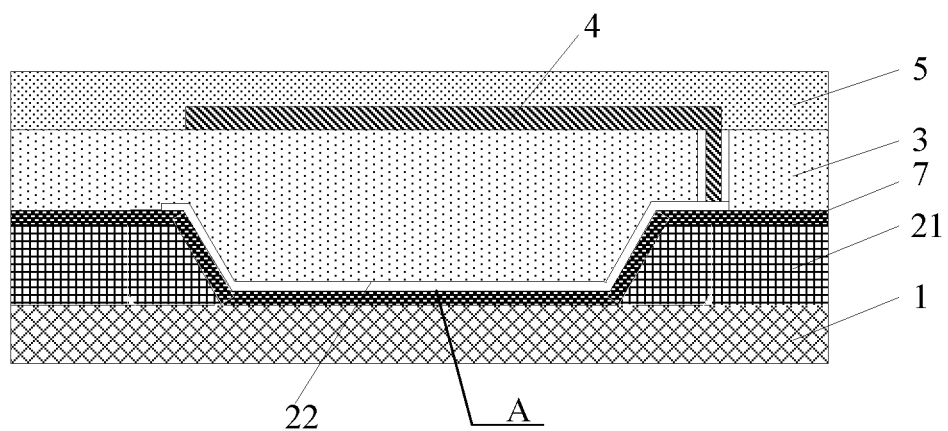

Specifically, referring to FIG. 3-5, a layer of light emitting material may be deposited on the first planarizing layer 3 and the first anode 4 to form the light emitting layer 5. The vertical distance between the bottom portion A of the concave reflecting film 22 and the light emitting layer 5 is a preset distance.

Step 305: forming a cathode 6 on the light emitting layer 5.

Referring to FIG. 1-1, a layer of metal oxide is deposited on the light emitting layer 5 to form a cathode 6, which may be IZO.

In the embodiments of the present disclosure, when the first anode and the cathode are energized, the light emitting layer emits light, and most of the generated light is irradiated in the direction towards the concave reflecting film. The concave reflecting film may reflect and convert the light generated by the light-emitting layer into collimated light with high-intensity. The collimated light is light propagating in the same direction, and the collimated light passes through the cathode to be emitted outside. As such, the light generated by the light emitting layer is propagated in the same direction as much as possible, thereby reducing the degree of crosstalk.

The foregoing is merely optional embodiments of the present disclosure and is not intended to limit the present disclosure. Any modification, equivalent substitution, improvement and the like within the spirit and principle of the present disclosure is intended to be within the protection scope of the present disclosure.

What is claimed is:

1. A light emitting module comprising:
   a substrate,
   a concave reflecting structure on the substrate,
   a first planarizing layer on the concave reflecting structure,
   a first anode on the first planarizing layer,
   a light emitting layer on the first anode, an opening of the concave reflecting structure facing the light emitting layer, and a vertical distance from a bottom of the concave reflecting structure to the light emitting layer being a preset distance, and
   a cathode on the light emitting layer.

2. The light emitting module according to claim 1, wherein the preset distance is a focal length of a concave lens corresponding to the concave reflecting structure.

3. The light emitting module according to claim 1, further comprising a second planarizing layer, wherein:
   the concave reflecting structure is a concave reflecting film,
   the second planarizing layer is arranged on the substrate, and the second planarizing layer is provided with a groove, and
   the concave reflecting film is provided on the groove of the second planarizing layer.

4. The light emitting module according to claim 3, wherein the material of the concave reflecting film is metal.

5. The light emitting module according to claim 3, wherein the second planarizing layer is provided with a second anode thereon, and the second anode is located between the second planarizing layer and the concave reflecting film, the first anode and the second anode being electrically connected.

6. The light emitting module according to claim 5, wherein the first planarizing layer is further provided with a via hole therein, and the first anode and the second anode are electrically connected with each other through the via hole.

7. A display device, comprising the light emitting module according to claim 1.

8. The display device according to claim 7, wherein the light emitting module comprises a plurality of light emitting modules arranged in an array, and
the second anodes of each row of light emitting modules are connected in series and the cathodes of each column of light emitting modules are connected in series, or
the cathodes of each row of light emitting modules are connected in series and the second anodes of each column of light emitting modules are connected in series.

9. A method for manufacturing a light emitting module, comprising:
forming a concave reflecting structure on a substrate,
forming a first planarizing layer on the concave reflecting structure,
forming a first anode on the first planarizing layer,
forming a light emitting layer on the first anode, an opening of the concave reflecting structure facing the light emitting layer and a vertical distance from a bottom of the concave reflecting structure to the light emitting layer being a preset distance, and
forming a cathode on the light emitting layer.

10. The method according to claim 9, wherein forming the concave reflecting structure on the substrate comprises:
forming a second planarizing layer on the substrate and forming a groove on the second planarizing layer by a single patterning process, and
forming a concave reflecting film on the groove.

* * * * *